(12) United States Patent
Crocherie et al.

(10) Patent No.: US 11,049,892 B2
(45) Date of Patent: Jun. 29, 2021

(54) IMAGE SENSOR

(71) Applicant: STMicroelectronics (Crolles 2) SAS, Crolles (FR)

(72) Inventors: Axel Crocherie, Grenoble (FR); Denis Rideau, Grenoble (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 16/451,856

(22) Filed: Jun. 25, 2019

(65) Prior Publication Data

US 2020/0013812 A1    Jan. 9, 2020

(30) Foreign Application Priority Data

Jul. 9, 2018 (FR) ...................................... 1856290

(51) Int. Cl.
*H01L 27/146* (2006.01)
*H04N 5/341* (2011.01)

(52) U.S. Cl.
CPC .. *H01L 27/14607* (2013.01); *H01L 27/14627* (2013.01); *H01L 27/14636* (2013.01); *H04N 5/341* (2013.01)

(58) Field of Classification Search
CPC ............ H01L 27/146–14641; H01L 31/02327
See application file for complete search history.

(56) References Cited

U.S. PATENT DOCUMENTS

| | | | |
|---|---|---|---|
| 5,767,507 A | 1/1998 | Ünlü et al. | |
| 2005/0040316 A1* | 2/2005 | Holm | H01L 27/14601 250/208.1 |
| 2006/0145223 A1* | 7/2006 | Ryu | H01L 27/14627 257/294 |
| 2008/0159658 A1* | 7/2008 | Yun | H01L 27/14685 382/321 |
| 2009/0256224 A1* | 10/2009 | Coudrain | H01L 27/14625 257/432 |
| 2012/0200852 A1* | 8/2012 | Tejada | G01J 3/12 356/326 |
| 2013/0082343 A1 | 4/2013 | Fudaba et al. | |
| 2013/0154041 A1* | 6/2013 | Kokubun | H01L 27/14621 257/432 |
| 2013/0240708 A1* | 9/2013 | Kokubun | H01L 31/02162 250/208.1 |
| 2015/0061063 A1 | 3/2015 | Kim et al. | |
| 2016/0027838 A1* | 1/2016 | Park | H01L 27/14627 257/440 |
| 2016/0225922 A1 | 8/2016 | Akkaya et al. | |
| 2017/0117421 A1* | 4/2017 | Okihara | H01L 31/1804 |
| 2018/0315788 A1* | 11/2018 | Kuo | G02B 5/207 |
| 2019/0131339 A1* | 5/2019 | Chiang | H01L 27/1464 |

* cited by examiner

*Primary Examiner* — Eric A. Ward
(74) *Attorney, Agent, or Firm* — Slater Matsil, LLP (57) ABSTRACT

A multispectral image sensor includes a semiconductor layer and a number of pixels formed inside and on top of the semiconductor layer. The pixels include a first pixel of a first type formed inside and on top of a first portion of the semiconductor layer and a second pixel of a second type formed inside and on top of a second portion of the semiconductor layer. The first pixel has a first thickness that defines a vertical cavity resonating at a first wavelength and the second pixel has a second thickness different from the first thickness. The second thickness defines a vertical cavity resonating at a second wavelength different than the first wavelength.

19 Claims, 6 Drawing Sheets

IMAGE SENSOR

CROSS-REFERENCE TO RELATED APPLICATIONS

This application claims priority to French Patent Application No. 1856290, filed on Jul. 9, 2018, which application is hereby incorporated herein by reference.

TECHNICAL FIELD

The present disclosure concerns the field of image sensors.

BACKGROUND

Conventionally, an image sensor comprises a semiconductor layer inside and on top of which a plurality of pixels are formed. Each pixel particularly comprises an active photosensitive area formed in the semiconductor layer, generally corresponding to a photodiode and can further comprise one or a plurality of control transistors formed inside and on top of the semiconductor layer.

In a multispectral image sensor such as a color image sensor, each pixel conventionally comprises a filtering element arranged on the side of the illuminated surface of the semiconductor layer, opposite the photosensitive area of the pixel, capable of filtering the incident radiation to transmit to the photosensitive area of the pixel only the light radiation received in a restricted wavelength range specific to the pixel, corresponding to the pixel measurement range. In other words, pixels of different types, that is, having different measurement wavelength ranges, differ from one another essentially by the nature of their respective filtering elements.

Conventionally, the filtering elements of the pixels of a multispectral image sensor are formed by means of colored resins, for example, organic resins. One specific resin per pixel type should in particular be provided. This makes the manufacturing of such a sensor relatively complex, and this all the more as the number of types of sensor pixels is high and as the lateral dimensions of the pixels are small.

SUMMARY

The present disclosure concerns the field of image sensors. Particular embodiments relate to a multispectral image sensor, that is, a sensor comprising a plurality of pixels, among which pixels of different types are capable of measuring light rays in different wavelength ranges.

Embodiments can overcome all or some of the disadvantages of known multispectral image sensors.

An embodiment provides a multispectral image sensor comprising a plurality of pixels formed inside and on top of a semiconductor layer. The plurality of pixels comprise at least one pixel of a first type formed inside and on top of a first portion of the semiconductor layer having a first thickness selected to define a vertical cavity resonating at a first wavelength. At least one pixel of a second type is formed inside and on top of a second portion of the semiconductor layer having a second thickness different from the first thickness selected to define a vertical cavity resonating at a second wavelength different from the first wavelength.

According to an embodiment, the first pixel comprises a first active photosensitive area formed in the first portion of the semiconductor layer, and the second pixel comprises a second active photosensitive area formed in the second portion of the semiconductor layer.

According to an embodiment, the first and second portions of the semiconductor layer are laterally delimited by vertical insulating walls.

According to an embodiment, the front and back sides of the semiconductor layer are coated with an insulating material having a refraction index smaller than that of the material of the semiconductor layer.

According to an embodiment, the front sides of the first and second portions of the semiconductor layer are substantially coplanar.

According to an embodiment, the front side of the semiconductor layer is coated with a stack of insulating and metal layers having metallizations of interconnection of the sensor pixels formed therein.

According to an embodiment, the sensor is intended to be back-side illuminated.

According to an embodiment, the sensor comprises a number n greater than 2 of different pixel types formed inside and on top of portions of the semiconductor layer having different thicknesses selected to define vertical cavities resonating at different wavelengths.

According to an embodiment, n is greater than or equal to 4.

According to an embodiment, the first and second portions of the semiconductor layer have identical lateral dimensions.

According to an embodiment, the first and second portions of the semiconductor layer have different lateral dimensions.

Another embodiment provides a multispectral image sensor comprising a plurality of pixels formed inside and on top of a semiconductor layer, each pixel comprising an active photosensitive area formed in a portion of the semiconductor layer laterally delimited by peripheral insulating walls, the plurality of pixels comprising at least one pixel of a first type where the portion of semiconductor layer of the pixel has a first lateral dimension selected to define a lateral cavity resonating at a first wavelength, and at least one pixel of a second type where the portion of semiconductor layer of the pixel has a second lateral dimension different from the first dimension, selected to define a lateral cavity resonating at a second wavelength different from the first wavelength.

According to an embodiment, each pixel comprises a diffractive structure arranged on the back side of the portion of semiconductor layer of the pixel.

According to an embodiment, the diffractive structure is formed by a cavity formed in the portion of semiconductor layer of the pixel and filled with a material having a refraction index smaller than that of the material of the semiconductor layer.

According to an embodiment, the sensor is intended to be back-side illuminated.

According to an embodiment, the front side of the semiconductor layer is coated with a stack of insulating and metal layers having metallizations of interconnection of the sensor pixels formed therein.

According to an embodiment, the peripheral insulating walls are formed of a metal wall sandwiched between two walls made of an insulating material.

According to an embodiment, the sensor comprises a number n greater than 2 of different pixel types formed inside and on top of the portions of the semiconductor layer having different lateral dimensions selected to define lateral cavities resonating at different wavelengths.

According to an embodiment, n is greater than or equal to 4.

According to an embodiment, the portions of the semiconductor layer of the pixels of the first and second types have substantially the same thickness.

According to an embodiment, the portions of the semiconductor layer of the pixels of the first and second types have different thicknesses.

The foregoing and other features and advantages will be discussed in detail in the following non-limiting description of specific embodiments in connection with the accompanying drawings.

DETAILED DESCRIPTION OF ILLUSTRATIVE EMBODIMENTS

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, in the examples described hereafter, the internal structure of the pixels, and particularly of the active photosensitive areas and of the possible control transistors, has not been detailed, the described examples being compatible with all or most of the known pixel structures, provided to make possible adaptations which are within the abilities of those skilled in the art based on the indications of the present disclosure.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred, unless otherwise specified, to the orientation of the drawings, it being understood that, in practice, the described sensors may be oriented differently.

The terms "about", "substantially", and "approximately" are used herein to designate a tolerance of plus or minus 10%, preferably of plus or minus 5%, of the value in question.

Figure 1:
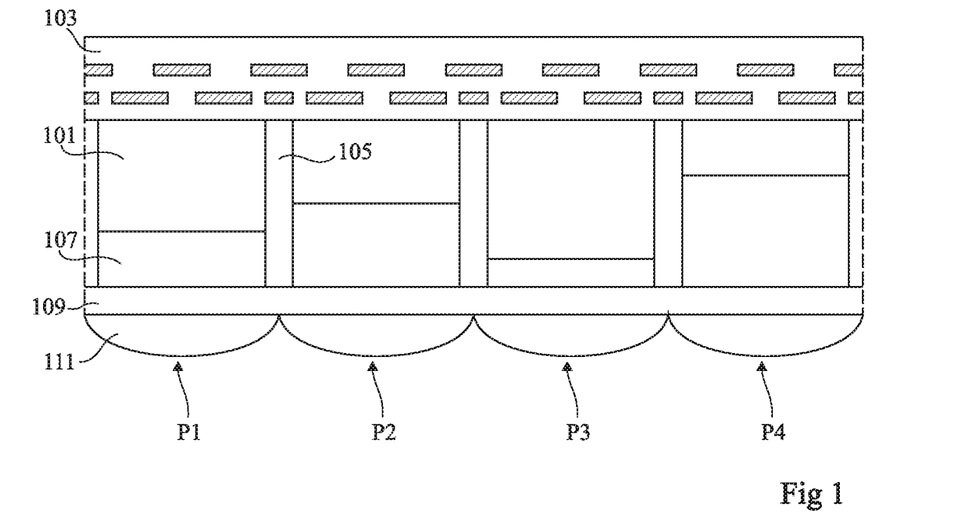
FIG. 1 is a cross-section view schematically and partially illustrating an example of a multispectral image sensor according to a first embodiment.

FIG. 1 is a cross-section view schematically and partially illustrating an example of a multispectral image sensor according to a first embodiment.

The sensor of FIG. 1 comprises a plurality of pixels, among which pixels of different types capable of measuring light radiations in different wavelength ranges. In FIG. 1, four adjacent pixels P1, P2, P3, and P4 of different types have been shown. More generally, the number of different pixels of the sensor may be any number greater than or equal to 2, it being understood that the described embodiments are particularly advantageous for sensors having a high number of pixel types, for example, greater than or equal to 4, greater than or equal to 5, or greater than or equal to 6. The sensor may comprise a plurality of pixels of each type, for example, distributed in an array of rows and columns, or a single pixel of each type, for example, to form a spectrometer.

The sensor of FIG. 1 is formed inside of and around a semiconductor layer 101, for example, a single-crystal silicon layer, for example, in CMOS technology. Semiconductor layer 101 comprises a front surface (its upper surface in the orientation of FIG. 1), coated with a stack 103 of insulating and metal layers in which, in particular, the various metallizations of interconnection of the sensor components are formed, and a rear surface (its lower surface in the orientation of FIG. 1), opposite to its front surface. The sensor of FIG. 1 is a back-side illuminated sensor, that is, it is intended to be illuminated on the rear surface of semiconductor layer 101.

Each of the pixels of the sensor of FIG. 1 comprises a portion of semiconductor layer 101, laterally delimited by a peripheral insulating wall 105 extending vertically in semiconductor layer 101, along substantially the entire height of layer 101. As an example, peripheral insulating walls 105 are made of an electrically-insulating material, for example, silicon oxide. As a variation, walls 105 comprise a central conductive wall, for example, made of polysilicon, sandwiched between two insulating walls made, for example, of silicon oxide. The central conductive wall may be biased to form a MOS capacitor with semiconductor layer 101. As a variation, the central conductive wall is made of a metal, for example, of tungsten, which enables to confine the light received by each pixel and to thus limit crosstalk phenomena, that is, to avoid for a photon received by a pixel of the sensor to cause the generation of an electron-hole pair in a neighboring pixel. As an example, in top view, peripheral insulating walls 105 form a continuous gate having dimensions substantially equal to the dimensions of the array of pixels of the sensor.

In each pixel, the portion of semiconductor layer 101 inside of and around which the pixel is formed comprises a photosensitive active area, for example, corresponding to a photodiode. The pixel may further comprise one or a plurality of control transistors formed inside and on top of semiconductor layer portion 101 of the pixel, on the front surface side of layer 101.

According to an aspect of the first embodiment, the portions of semiconductor layer 101 inside of and around which are formed pixels of different types of the sensor have different thicknesses (in the vertical direction). The portions of semiconductor layer 101 inside of and around which are formed pixels of the same type have substantially the same thickness.

More particularly, for each type of pixel of the sensor, the thickness of the portions of the semiconductor layer 101 inside of and around which the pixels of the considered type are formed is selected to define, in each pixel of the considered type, a vertical optical cavity resonating at one or a plurality of wavelengths specific to the considered pixel type. In other words, the thicknesses of the portions of semiconductor layer 101 where the sensor pixels are formed are selected so that the vertical optical cavities of pixels of the same type resonate substantially at the same wavelength or at the same wavelengths, and that the vertical optical cavities of pixels of different types resonate at different wavelengths.

It should be noted that, in each pixel, so that the portion of semiconductor layer 101 inside of and around which the pixel is formed defines a vertical optical cavity, the front and rear surfaces of the considered portion of semiconductor layer 101 should be reflective for light rays propagating inside of the portion. In the sensor of FIG. 1, this is obtained by the fact that each of the front and rear surfaces of semiconductor layer 101 is coated with (and in contact with) a layer of an insulating material having a refraction index smaller than that of the material of layer 101, for example, silicon oxide in the case where layer 101 is made of silicon.

In the example of FIG. 1, the front surface of semiconductor layer 101 is substantially planar, that is, the front surfaces of the portions of layer 101 inside of and around which the sensor pixels are formed are substantially in a same plane. The rear surface of semiconductor layer 101 is however structured. More particularly, the rear surfaces of the portions of layer 101 inside of and around which the sensor pixels are formed are substantially planar and coplanar for pixels of the same type, and are in non-coplanar parallel planes for pixels of different types.

In the example of FIG. 1, each pixel further comprises a transparent filling element 107 coating the rear surface of the portion of semiconductor layer 101 inside of and around which the pixel is formed. Filling elements 107 have the function of compensating for thickness differences between the portions of layer 101 of the pixels of different types of the sensor. In other words, for each pixel of the sensor, the thickness of filling element 107 is all the smaller as the thickness of layer portion 101 of the pixels is significant, and conversely, so that the rear surfaces of filling elements 107 of the sensor pixels are substantially in a same planar parallel to the plane of the front surface of semiconductor layer 101. Filling elements 107 of the pixels are all made of a same material, for example, silicon oxide.

In the example of FIG. 1, on the back side of the sensor, peripheral insulating walls 105 of the pixels are flush with the rear surface of filling elements 107 to define with the rear surface of filling elements 107 a substantially planar continuous surface. Further, in this example, an additional planarization layer 109, for example, made of silicon oxide, coats the rear surface of filling elements 107 and of peripheral insulating walls 105.

In the example of FIG. 1, each pixel further comprises a microlens 111 arranged on the back side of the sensor, opposite the portion of layer 101 of the pixel, capable of focusing the incident light towards the active photosensitive area of the pixel. More particularly, in this example, microlenses 111 are arranged on the rear surface of planarization layer 109.

In operation, in each pixel of the sensor, the incident radiation is transmitted in semiconductor layer 101 via microlens 111, planarization layer 109, and transparent filling element 107. In this example, elements of the sensor coating the rear surface of semiconductor layer 101 have substantially the same frequency response for all the sensor pixels. The incident light penetrates into semiconductor layer 101 through its rear surface, and is then alternately reflected on its front surface and on its rear surface. The vertical optical cavity thus defined has one or a plurality of resonance wavelength in the wavelength range transmitted to semiconductor layer 101. This results in one or a plurality of peaks of light absorption by semiconductor layer 101 at the resonance wavelength(s). Thus, although a wide wavelength range is transmitted to semiconductor layer 101, the quantity of photogenerated charges collected in the active photosensitive area of each pixel is mainly representative of the light intensity received a the resonance wavelength(s) of the pixel. The pixels of different types, having different resonance wavelengths, thus measure light intensities at different wavelengths.

It should be noted that in the example of FIG. 1, the sensor pixels all have substantially identical lateral dimensions. In other words, in the sensor of FIG. 1, the pixels of a same type are all identical or similar, and the pixels of different types differ from one another only by the thicknesses of the portions of semiconductor layer 101 inside of and around which they are respectively formed (and accordingly by the thicknesses of their respective filling elements 107).

An advantage of the embodiment of FIG. 1 is that it enables to form a multispectral image sensor without having to form filtering elements made of different materials on pixels of different type (that is, intended to measure light rays in different wavelength ranges).

FIGS. 2, 3, 4, 5, 6, 7, 8, and 9 are cross-section views schematically illustrating steps of an example of a method of manufacturing a multispectral image sensor of the type described in relation with FIG. 1. It should be noted that as compared with the representation of FIG. 1, the vertical orientations are inverted, that is, in the views of FIGS. 2, 3, 4, 5, 6, 7, 8, and 9, the front surface corresponds to the lower surface and the rear surface corresponds to the upper surface. Further, in the example of FIGS. 2, 3, 4, 5, 6, 7, 8, and 9, for simplification, only the forming of two pixels of different types, respectively corresponding to pixels P1 (in the right-hand portion of FIGS. 2, 3, 4, 5, 6, 7, 8, and 9) and P2 (in the left-hand portion of FIGS. 2, 3, 4, 5, 6, 7, 8, and 9) of the sensor of FIG. 1 has been detailed. In practice, if the sensor comprises a plurality of pixels of a same type, the steps specific to the considered pixel type are formed simultaneously for all the pixels of this type.

Figure 2:
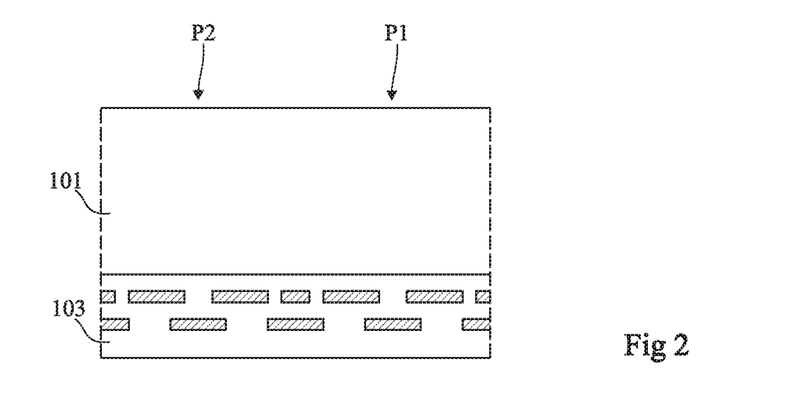
FIG. 2 is a cross-section view schematically showing the structure of an example of an image sensor pixel according to a first embodiment.

FIG. 2 shows an initial structure that comprises a semiconductor layer 101 having a uniform thickness, inside and on top of which have been formed, for each pixel of the sensor, an active photosensitive area and, possibly, one or a plurality of pixel control transistors (not detailed in the drawing). An interconnection stack 103 coats the front surface (lower surface in the orientation of FIG. 2) of layer 101.

A process to form the structure of FIG. 2 can start, for example, from a relatively thick semiconductor substrate, for example, thicker than 100 μm, after which the active photosensitive areas, and possibly, the sensor pixel control transistors, are formed inside and on top of the substrate, on the front surface side thereof. Interconnection stack 103 is then formed on the front surface side of the substrate, after which the substrate is thinned from its rear surface to only keep semiconductor layer 101, for example, having a thickness smaller than 10 μm. To ensure the mechanical resistance of the sensor, a support handle (not shown) may be placed against the front surface of interconnection stack 103 before the semiconductor substrate thinning step. At this stage, the portions of semiconductor layer 101 inside of and around which the different sensor pixels are formed are not insulated from one another.

Figure 3:
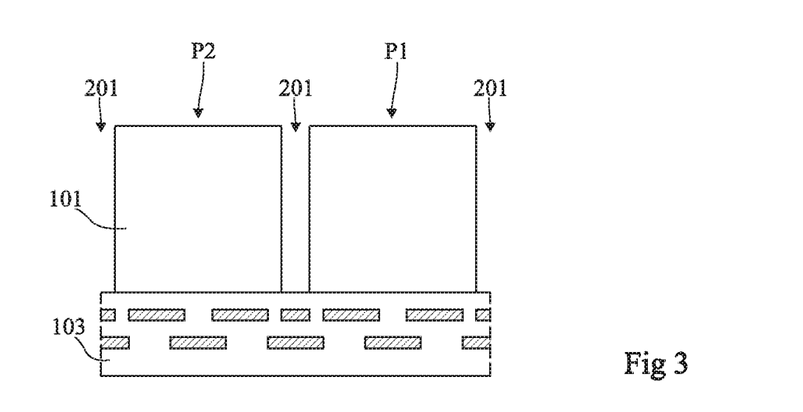
FIG. 3 is a cross-section view schematically illustrating another step of an example of a method of manufacturing an image sensor according to the first embodiment.

FIG. 3 illustrates a step of etching, from the rear surface of semiconductor layer 101, vertical trenches 201 insulating from one another the portions of semiconductor layer 101 inside of and around which the different sensor pixels are formed. In top view, in each pixel of the sensor, the portion of semiconductor layer 101 inside of and around which the pixel is formed is totally surrounded with a trench 201. In the present example, trenches 201 extend vertically across the entire thickness of semiconductor layer 101, and are interrupted at the level of the rear surface of interconnection stack 103.

Figure 4:
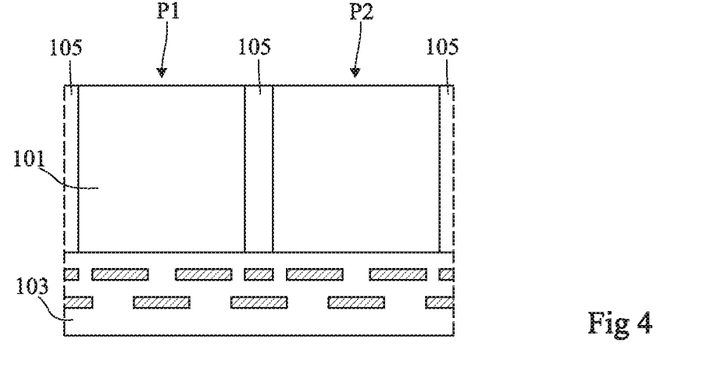
FIG. 4 is a cross-section view schematically illustrating another step of an example of a method of manufacturing an image sensor according to the first embodiment.

FIG. 4 illustrates a step of filling trenches 201 to form vertical walls 105 for insulating the sensor pixels. As an example, trenches 201 may be totally filled with an insulating material, for example, silicon oxide. As a variation, only the walls of the trenches are coated with an insulating material, for example, silicon oxide, the trenches being then filled with a conductive material, for example, polysilicon or a metal such as tungsten. Before the filling of the trenches, a protective coating, for example, made of silicon nitride, may possibly be deposited over the trench walls. One or a plurality of steps of planarization, for example, by chem.-mech. polishing (CMP), may possibly be provided so that the rear surface of peripheral insulating walls 105 is flush with the rear surface of semiconductor layer 101.

As a variation, the steps of etching trenches 201 (FIG. 3) and of filling trenches 201 (FIG. 4) may be implemented from the front surface of substrate 101, before the forming of interconnection stack 103 and the thinning of substrate 101 from its rear surface. In this case, the depth of trenches 201 may be selected to be substantially equal to or greater than the final thickness of substrate 101 after the thinning, so that, at the end of the step of thinning substrate 101, peripheral insulating walls 105 are flush with the rear surface of substrate 101.

Figure 5:
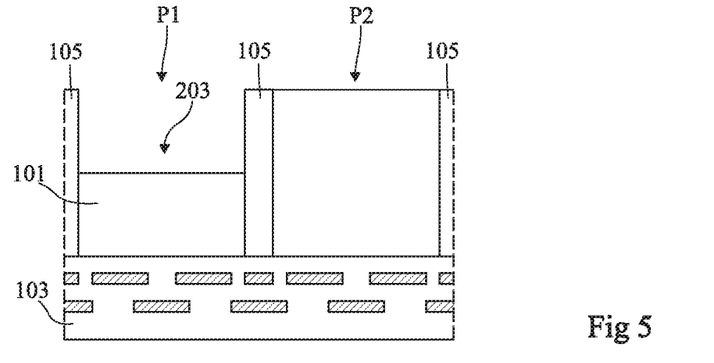
FIG. 5 is a cross-section view schematically illustrating another step of an example of a method of manufacturing an image sensor according to the first embodiment.

FIG. 5 illustrates a step of thinning semiconductor layer 101 from its rear surface, located at the level of pixel P1. More particularly, during this step, the portion of semiconductor layer 101 inside of and around which pixel P1 is formed is etched from its rear surface, substantially uniformly over its entire surface, to obtain the targeted thickness enabling to form a cavity resonating at the wavelengths desired for pixel P1. During this step, a mask (not shown) protects pixel P2, and more generally, all the pixels of types different from pixel P1, from the etching. The pixels of the same type as pixel P1 are etched at the same time as pixel P1. The etch method is selected to selectively etch semiconductor layer 101 over peripheral insulating walls 105. Thus, at the end of the etch step of FIG. 5, a recess 203 laterally delimited by insulating walls 105 is obtained in pixel P1 (and, possibly, in all the pixels of the same type as pixel P1), opposite the rear surface of semiconductor layer 101.

Figure 6:
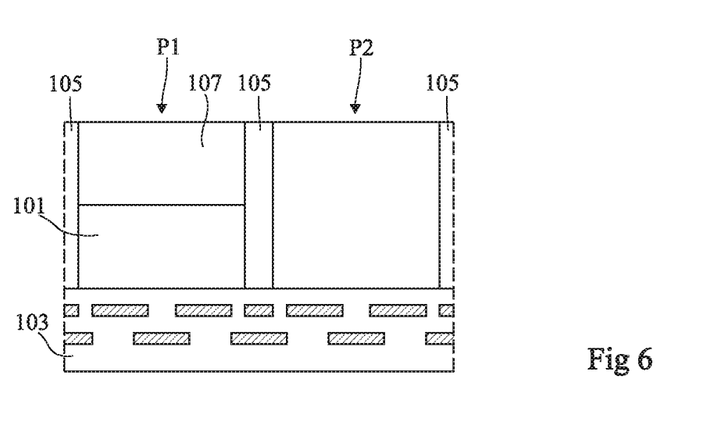
FIG. 6 is a cross-section view schematically illustrating another step of an example of a method of manufacturing an image sensor according to the first embodiment.

FIG. 6 illustrates a step during which recess 203 is filled with a filling element 107 made of a material transparent for the radiation to be measured, for example, silicon oxide. As an example, the filling material is deposited all over the back side of the sensor, across a thickness sufficient to fill recess 203, after which a step of planarization, for example, by chem.-mech. polishing (CMP), is provided to remove the excess filling material. At the end of this step, the rear surface of filling element 107 of pixel P1 is flush with the rear surface of peripheral insulating walls 105 and is at the same level as the rear surface of semiconductor layer 101 in pixel P2.

Figure 7:
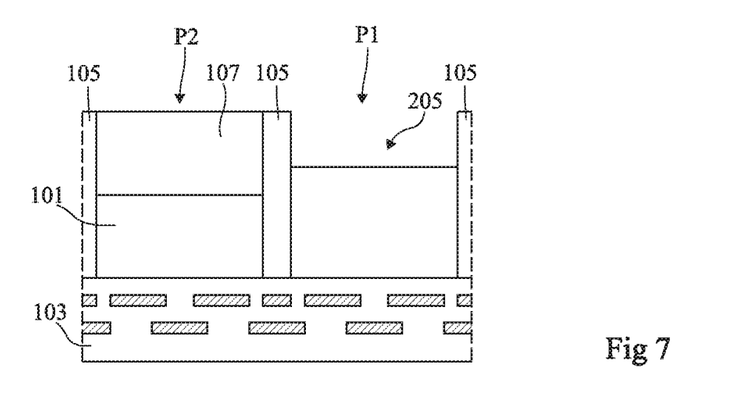
FIG. 7 is a cross-section view schematically illustrating another step of an example of a method of manufacturing an image sensor according to the first embodiment.

FIG. 7 illustrates a step of thinning semiconductor layer 101 from its rear surface, located at the level of pixel P2. More particularly, during this step, the portion of semiconductor layer 101 inside of and around which pixel P2 is formed is etched from its rear surface, substantially uniformly over its entire surface, to obtain the targeted thickness enabling to form a cavity resonating at the wavelengths desired for pixel P2. During this step, a mask (not shown) protects pixel P1, and more generally, all the pixels of types different from pixel P2, from the etching. The pixels of the same type as pixel P2 are etched at the same time as pixel P2. The etch method is selected to selectively etch semiconductor layer 101 over peripheral insulating walls 105. Thus, at the end of the etch step of FIG. 7, a recess 205 laterally delimited by insulating walls 105 is obtained in pixel P2 (and, possibly, in all the pixels of the same type as pixel P2), opposite the rear surface of semiconductor layer 101.

Figure 8:
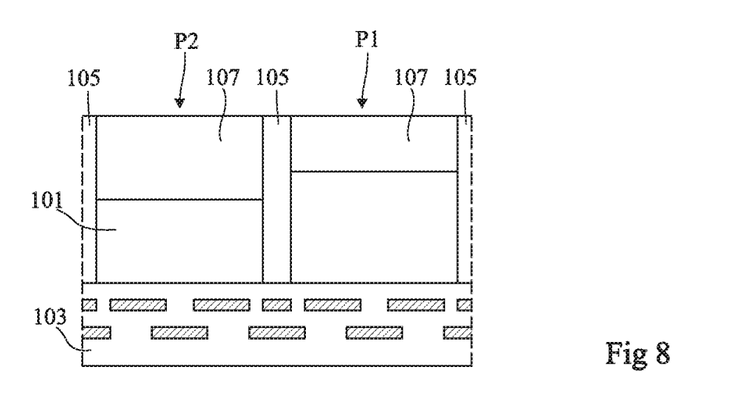
FIG. 8 is a cross-section view schematically illustrating another step of an example of a method of manufacturing an image sensor according to the first embodiment.

FIG. 8 illustrates a step during which recess 205 is filled with a filling element 107 made of a material transparent for the radiation to be measured, for example, made of silicon oxide. As an example, the filling material is deposited all over the back side of the sensor, across a thickness sufficient to fill recess 203, after which a step of planarization, for example, by chem.-mech. polishing (CMP), is provided to remove the excess filling material. At the end of this step, the rear surface of filing element 107 of pixel P2 is flush with the rear surface of peripheral insulating walls 105 and is at the same level as the rear surface of filling element 107 of pixel P1.

The steps of FIGS. 7 and 8 may be repeated as many times as the sensor comprises different pixel types, by each time adapting the etch depth of layer 101 according to the resonance wavelength(s) desired for each pixel type.

Figure 9:
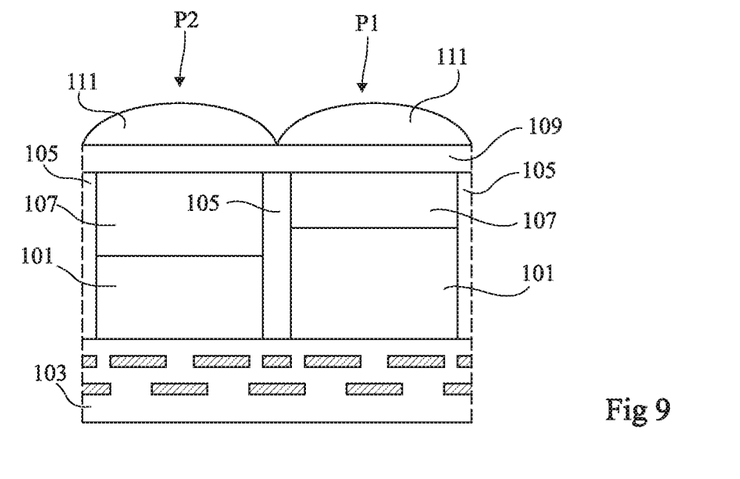
FIG. 9 is a cross-section view schematically illustrating another step of an example of a method of manufacturing an image sensor according to the first embodiment.

FIG. 9 illustrates a subsequent step of deposition of planarization layer 109 on the back side of the structure obtained at the end of the previous steps. Layer 109 is for example a continuous layer having a substantially uniform thickness, extending over the entire surface of the sensor. FIG. 9 further illustrates a step of forming microlenses 111 on the rear surface of planarization layer 109. As an example, the sensor comprises one microlens 111 per pixel, arranged opposite the photosensitive area of the pixel.

Figure 10:
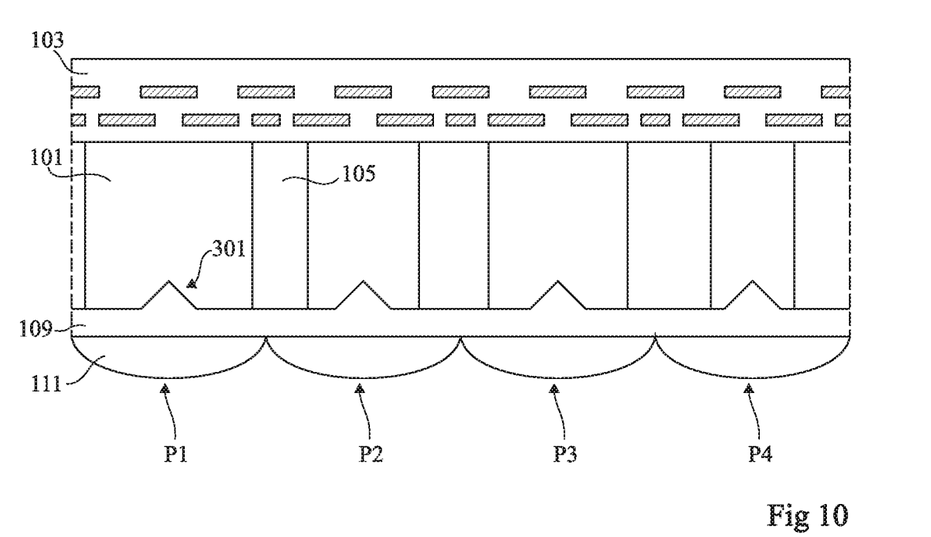
FIG. 10 is a cross-section view schematically and partially illustrating an example of a multispectral image sensor according to a second embodiment.

FIG. 10 is a cross-section view schematically and partially illustrating an example of a multispectral image sensor according to a second embodiment. It should be noted that the sensor of FIG. 10 comprises elements common with the sensor of FIG. 1. Hereafter, the common elements will not be described again and only the differences with respect to the sensor of FIG. 1 will be detailed.

As in the example of FIG. 1, the sensor of FIG. 10 comprises a plurality of pixels, among which pixels of different types capable of measuring light radiations in different wavelength ranges. In FIG. 10, four adjacent pixels P1, P2, P3, and P4 of different types have been shown.

The sensor of FIG. 10 differs from the sensor of FIG. 1 in that, in the example of FIG. 10, semiconductor layer 101 inside of and around which the sensor pixels are formed has substantially the same thickness in all the sensor pixels.

As in the example of FIG. 1, each of the sensor pixels comprises a portion of semiconductor layer 101, laterally delimited by a peripheral insulating wall 105 extending vertically in semiconductor layer 101, along substantially the entire height of layer 101, having the active photosensitive area of the pixels formed therein.

According to an aspect of the second embodiment, the portions of semiconductor layer 101 having the active photosensitive areas of pixels of different types formed therein have different lateral dimensions (in the horizontal direction). The portions of semiconductor layer 101 having the active photosensitive areas of pixels of the same type formed therein have substantially identical lateral dimensions. It should be noted that lateral dimensions here means, as an example, the diameter in the case where semiconductor layer portions 101 of the pixels have a circular shape (in top view), or the width and/or the length in the case where the portions of semiconductor layer 101 of the pixels have a square or rectangular shape (in top view).

More particularly, for each type of pixel of the sensor, the lateral dimensions of the portions of the semiconductor layer 101 inside of and around which the pixels of the considered type are formed are selected to define, in each pixel of the considered type, a vertical optical cavity resonating at one or a plurality of wavelengths specific to the considered pixel type. In other words, the lateral dimensions of the portions of semiconductor layer 101 having the sensor pixels formed therein are selected so that the lateral optical cavities of the pixels of a same type resonate substantially at the same wavelength or at the same wavelengths, and that the lateral optical cavities of the types of different types resonate at different wavelengths.

In the example of FIG. 10, the pitch between pixels, that is, the center-to-center distance between two neighboring pixels of the sensor, is substantially the same for all the sensor pixels. Thus, to define portions of semiconductor layer 101 of different lateral dimensions in different pixels of the sensor, the widths of peripheral insulating walls 105 are varied. More particularly, in this example, in each pixel of the sensor, the width of peripheral insulating walls 105 of the pixel is all the smaller as the lateral dimensions of the portion of layer 101 of the pixel are significant, and conversely.

In the sensor of FIG. 10, each pixel further comprises, on the rear surface of semiconductor layer 101, a diffractive structure 301 capable of deviating the light at entering the portion of semiconductor layer 101 of the pixel, so that the major part of the light received by the pixel propagates along a substantially horizontal direction within the portion of semiconductor layer 101 of the pixel. Diffractive structure 301 for example comprises a single or a plurality of cavities formed in the portion of semiconductor layer 101 of the pixel, on its rear surface, and filled with a material having a refraction index different from that of semiconductor layer 101, for example, a material having a refraction index smaller than that of semiconductor layer 101, for example, silicon oxide in the case where layer 101 is made of silicon.

The cavity or cavities of diffractive structure 301 for example have a depth smaller than one tenth of the thickness of semiconductor layer 101, for example, a depth smaller than 250 nm. In the shown example, in each pixel, diffractive structure 301 comprises a single cavity of conical or pyramidal shape, arranged substantially at the center of the pixel, having its base flush with the rear surface of layer 101 and having its top facing the front surface of layer 101. The described embodiment are however not limited to this specific shape. Diffractive structures 301 are for example identical in all the sensor pixels.

As a variation (not shown), in each pixel, the rear surface of semiconductor layer 101 may be substantially planar, diffractive structure 301 being then formed under the rear surface of layer 101, in insulating layer 109. In this case, diffractive structure 301 may comprise one or a plurality of cavities formed in insulating layer 109 and filled with a material having a refraction index different from that of layer 109, for example, a material having a refraction index greater than that of layer 109, for example, polysilicon.

It should be noted that, in each pixel, so that the portion of semiconductor layer 101 inside of and around which the pixel is formed defines a resonating lateral optical cavity, the lateral sides of the considered portion of semiconductor layer 101 should be reflective for light rays propagating inside of the portion of semiconductor layer 101. In the sensor of FIG. 10, this is obtained by the fact that, in each pixel, each of the lateral surfaces of the portion of semiconductor layer 101 of the pixel is coated with a layer of an insulating material having a refraction index smaller than that of the material of layer 101, for example, silicon oxide in the case where layer 101 is made of silicon. As in the embodiment of FIG. 1, the peripheral insulating walls may comprise a central conductive wall, for example, metallic, favoring lateral reflections and the confinement of light within the optical cavity.

In the example of FIG. 10, an additional planarization layer 109, for example, made of silicon oxide, coats the back side of the sensor, and particularly the rear surface of the portions of semiconductor layer 101 and of peripheral insulating walls 105 of the sensor pixels.

In the example of FIG. 10, each pixel further comprises a microlens 111 arranged on the back side of the sensor, opposite the portion of layer 101 of the pixel, capable of focusing the incident light towards the active photosensitive area of the pixel. More particularly, in this example, microlenses 111 are arranged on the rear surface of planarization layer 109.

In operation, in each pixel of the sensor, the incident radiation is transmitted in semiconductor layer 101 via microlens 111 planarization layer 109, and diffractive structure 301. As in the example of FIG. 1, the sensor elements coating the rear surface of semiconductor layer 101 have substantially the same frequency response for all the sensor pixels.

The incident light penetrates into semiconductor layer 101 from its rear surface, is deviated by diffractive structure 301, and then is alternately reflected on its lateral surfaces. The lateral optical cavity thus defined has one or a plurality of resonance wavelengths. This results in one or a plurality of peaks of light absorption by semiconductor layer 101 at the resonance wavelength(s). Thus, although a wide range of wavelengths is transmitted to semiconductor layer 101, the quantity of photogenerated charges measured by each pixel is mainly representative of the light intensity received at the resonance wavelengths of the pixel. The pixels of different types, having different resonance wavelengths, thus measure light intensities at different wavelengths.

It should be noted that in the example of FIG. 10, the pixels of a same type are all identical or similar, and the pixels of different types differ from one another only by the lateral dimensions of the portions of semiconductor layer 101 inside of and around which they are respectively formed.

An advantage of the embodiment of FIG. 10 is that it enables to form a multispectral image sensor without having to form filtering elements made of different materials on pixels of different type (that is, intended to measure light rays in different wavelength ranges).

FIGS. 11, 12, 13, 14, and 15 are cross-section views schematically illustrating steps of an example of a method of manufacturing a multispectral image sensor of the type described in relation with FIG. 10. It should be noted that as compared with the representation of FIG. 10, the vertical orientations are inverted, that is, in the views of FIGS. 11, 12, 13, 14, and 15, the front surface corresponds to the lower surface and the rear surface to the upper surface. Further, in the example of FIGS. 11, 12, 13, 14, and 15, for simplification, only the forming of two pixels of different types, respectively corresponding to pixels P1 (in the right-hand portion of FIGS. 11 to 15) and P2 (in the left-hand portion of FIGS. 11 to 15) of the sensor of FIG. 10, has been detailed.

Figure 11:
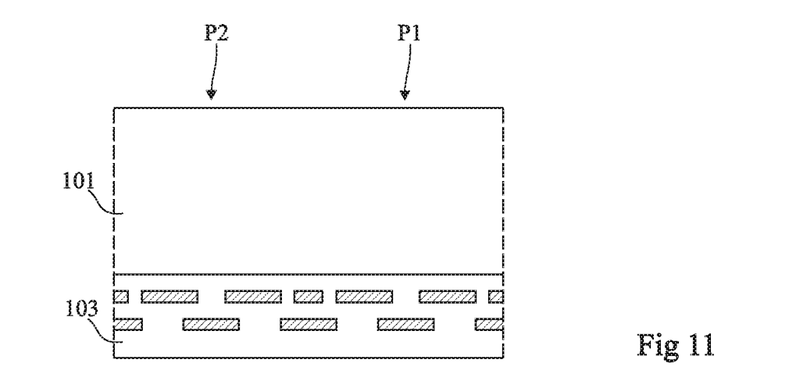
FIG. 11 is a cross-section view schematically illustrating a step of an example of a method of manufacturing an image sensor according to the second embodiment.

FIG. 11 shows an initial structure identical or similar to the structure of FIG. 2.

Figure 12:
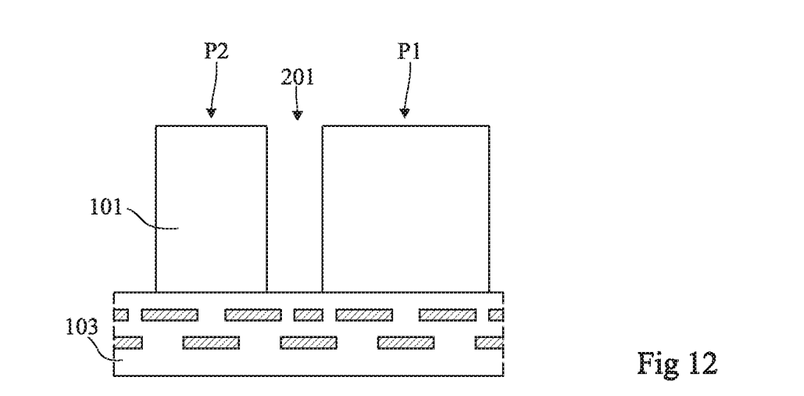
FIG. 12 is a cross-section view schematically illustrating another step of an example of a method of manufacturing an image sensor according to the second embodiment.

FIG. 12 illustrates a step similar to the step of FIG. 3 of etching, from the rear surface of semiconductor layer 101, vertical trenches 201 insulating from one another the portions of semiconductor layer 101 inside of and around which the different pixels of the sensor are formed. As compared with the step of FIG. 3, the main difference is that, in the step of FIG. 12, trenches 201 have widths which are variable according to the considered pixel type.

Figure 13:
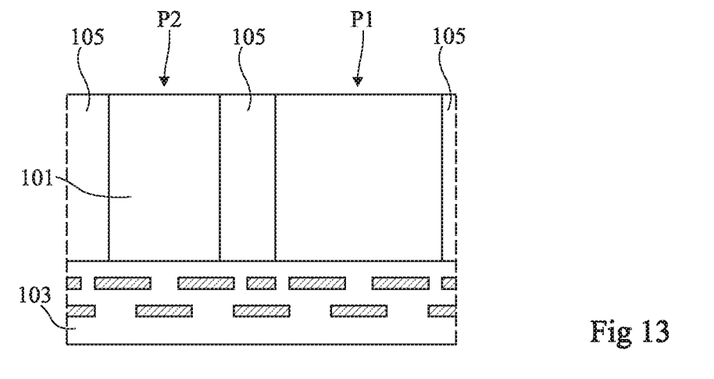
FIG. 13 is a cross-section view schematically illustrating another step of an example of a method of manufacturing an image sensor according to the second embodiment.

FIG. 13 illustrates a step similar to the step of FIG. 4, of filling trenches 201 to form vertical insulating walls 105 of the sensor pixels.

Figure 14:
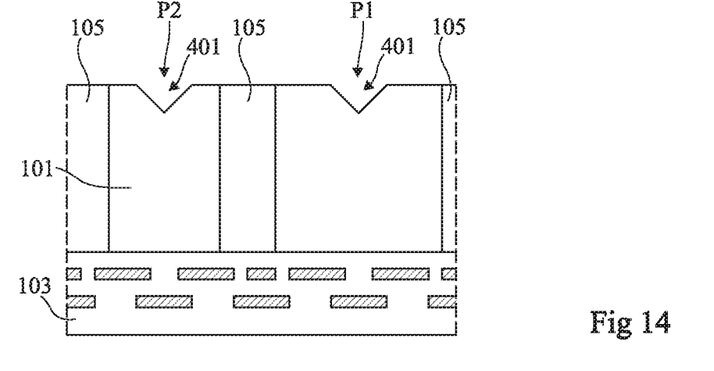
FIG. 14 is a cross-section view schematically illustrating another step of an example of a method of manufacturing an image sensor according to the second embodiment.

FIG. 14 illustrates a step of etching, in each pixel, on the rear surface of the portion of semiconductor layer 101 of the pixel, one or a plurality of cavities 401 to form the diffractive input structures 301 of the pixels.

Figure 15:
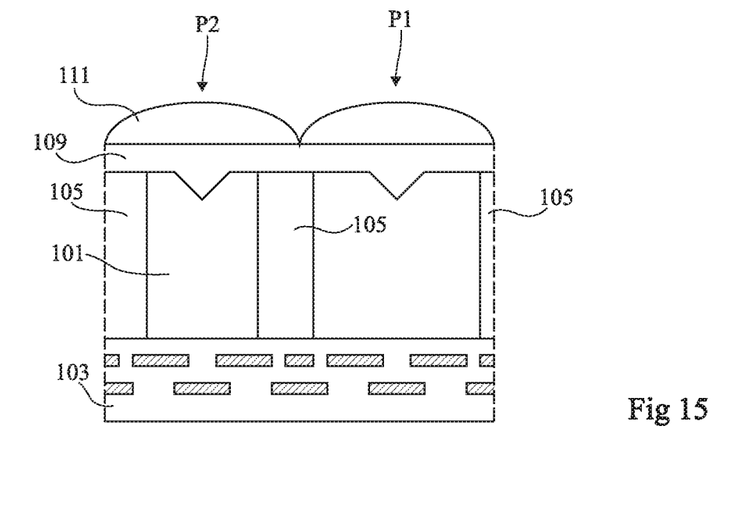
FIG. 15 is a cross-section view schematically illustrating another step of a method of manufacturing an image sensor according to the second embodiment.

FIG. 15 illustrates a subsequent step of deposition of planarization layer 109 on the back side of the structure obtained at the end of the previous steps. Layer 109 is for example a continuous layer, extending all over the sensor surface. In this example, the material of planarization layer 109, for example, silicon oxide, also fills cavities 401, resulting in the forming of diffractive structures 301. FIG. 15 further illustrates a step similar to the step of FIG. 9, of forming microlenses 111 on the rear surface of planarization layer 109.

Figure 16:
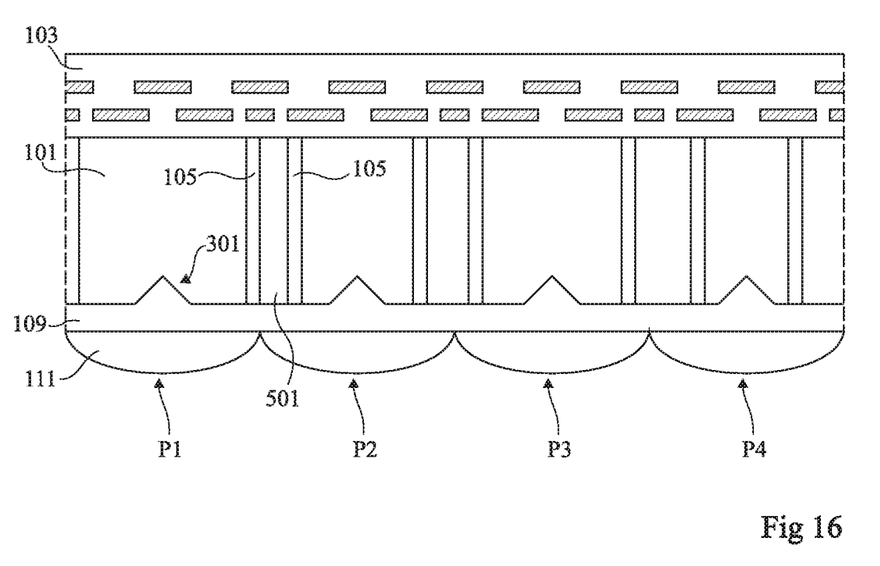
FIG. 16 is a cross-section view schematically and partially illustrating an alternative embodiment of an image sensor according to the second embodiment.

FIG. 16 is a cross-section view schematically and partially illustrating an alternative embodiment of the image sensor of FIG. 10.

The sensor of FIG. 16 differs from the sensor of FIG. 10 mainly in that, in the example of FIG. 16, in each pixel, the portion of semiconductor layer 101 containing the active photosensitive area of the pixel is totally surrounded with a peripheral insulating wall 105 specific to the pixel (and not shared by two neighboring pixels as in the example of FIG. 10). In other words, in this example, the active photosensitive areas of two neighboring pixels are laterally separated by two peripheral insulating walls 105, having a portion 501 of semiconductor layer 101, which contains no active photosensitive area, extending therebetween. As an example, in top view, regions 501 form a continuous grid having dimensions substantially equal to the dimensions of the array of pixels of the sensor, separating from one another the different pixels of the sensor.

In the example of FIG. 16, the pitch between pixels, that is, the center-to-center distance between two neighboring pixels of the sensor, is substantially the same for all the sensor pixels. Further, the width (in the horizontal direction) of peripheral insulating walls 105 is substantially the same for all the pixels of the sensor. Thus, to define portions of semiconductor layer 101 having different lateral dimensions in different pixels of the sensor, the width of inactive portions 501 of semiconductor layer 101 separating the pixels is varied. More particularly, in each pixel of the sensor, the width of separation portion 501 of layer 101 is all the smaller as the lateral dimensions of the portion of layer 101 containing the active photosensitive area of the pixel is large, and conversely.

As compared with the sensor of FIG. 10, an advantage of the sensor of FIG. 16 is that all peripheral insulating walls 105 of the sensor have substantially the same width, which makes the forming of the sensor easier.

Various embodiments and variations have been described. It will be understood by those skilled in the art that certain features of these various embodiments and variations may be combined, and other variations will occur to those skilled in the art. In particular, the first and second embodiments may be combined, that is, an image sensor comprising pixels arranged to have a vertical resonance operation such as described in relation with FIG. 1, and pixels of different type arranged to have a lateral resonance operation such as described in relation with FIGS. 10 and 16, may be provided. A sensor having pixels of different types, differing from one another both by the lateral dimensions and by the thickness of the portions of semiconductor layer 101 containing the active photosensitive areas of the pixels, may in particular be provided.

Further, the described embodiments are not limited to the examples of materials and of dimensions mentioned in the present disclosure.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A multispectral image sensor comprising:
    a semiconductor layer comprising a first portion having a first thickness, a second portion having a second thickness different from the first thickness, a third portion having a third thickness different than the first and second thicknesses, and a fourth portion having a fourth thickness being different from the first thickness, the second thickness, and the third thickness;

a fill layer comprising a first fill region having a first fill thickness, a second fill region having a second fill thickness different from the first fill thickness, a third fill region having a third fill thickness different than the first and second fill thicknesses, and a fourth fill region having a fourth fill thickness being different from the first fill thickness, the second fill thickness, and the third fill thickness, the fill layer physically contacting a rear surface of the semiconductor layer;

an interconnection stack disposed over and physically contacting a front surface of the semiconductor layer, the interconnection stack comprising a stack of insulating and metal layers;

an insulating planarizing layer disposed under and physically contacting a coplanar surface comprising the first fill region, the second fill region, the third fill region, and the fourth fill region, wherein the semiconductor layer is disposed between the interconnection stack and the fill layer; and a plurality of pixels formed inside and on top of the semiconductor layer, the plurality of pixels comprising a first pixel that comprises the first region, a second pixel that comprises the second region, a third pixel that comprises the third region, and a fourth pixel that comprises the fourth region, wherein the first thickness defines a first vertical cavity resonating at a first wavelength, the second thickness defining a second vertical cavity resonating at a second wavelength different than the first wavelength, the third thickness defining a third vertical cavity resonating at a third wavelength different than the first and second wavelengths, the fourth thickness defining a fourth vertical cavity resonating at a fourth wavelength different than the first, second, and third wavelengths, the second pixel disposed between the third pixel and the first pixel, the third pixel disposed between the fourth pixel and the second pixel, the second thickness being greater than both the first thickness and the third thickness, the fourth thickness being greater than both the first thickness and the third thickness.

2. The sensor of claim 1, wherein the first pixel comprises a first active photosensitive area formed in the first portion of the semiconductor layer and the second pixel comprises a second active photosensitive area formed in the second portion of the semiconductor layer.

3. The sensor of claim 1, wherein the first and second portions of the semiconductor layer are laterally delimited by an insulating wall.

4. The sensor of claim 1, wherein the interconnection stack and the insulating planarizing layer comprise an insulating material having a refraction index smaller than that of a material of the semiconductor layer.

5. The sensor of claim 1, wherein front surfaces of the first and second portions of the semiconductor layer are substantially coplanar.

6. The sensor of claim 5, wherein the sensor is configured to be back-side illuminated.

7. The sensor of claim 1, wherein the sensor comprises more than two different types of pixels formed inside and on top of portions of the semiconductor layer, each having different thicknesses selected to define vertical cavities resonating at different wavelengths.

8. The sensor of claim 7, wherein the sensor comprises four or more different types of pixels.

9. The sensor of claim 1, wherein the first and second portions of the semiconductor layer have the same lateral dimensions.

10. The sensor of claim 1, wherein the first and second portions of the semiconductor layer have different lateral dimensions.

11. A method of forming an image sensor, the method comprising:
forming active photosensitive areas in a thick semiconductor substrate;
forming an interconnection stack over a front side of the thick semiconductor substrate, the interconnection stack comprising a stack of insulating and metal layers;
after forming the interconnection stack, thinning the thick semiconductor substrate to a semiconductor substrate;
etching a trench in the semiconductor substrate to separate a first portion of the semiconductor substrate from a second portion of the semiconductor substrate;
filling the trench with an insulating material;
etching the first portion of the semiconductor substrate to a first selected thickness while covering the second portion from being etched;
forming a first fill material region over a remaining portion of the first portion of the semiconductor substrate;
etching the second portion of the semiconductor substrate to a second selected thickness that is different than the first selected thickness while covering the first fill material region from being etched;
forming a second fill material region over a remaining portion of the second portion of the semiconductor substrate;
coating exposed major surfaces of the first fill material region, the second fill material region, and the insulating material in the trench with a planarization layer made of an insulating material; and
forming a microlens layer over the first and second portions of the semiconductor substrate.

12. The method of claim 11, wherein the first portion of the semiconductor substrate comprises a first active photosensitive area forming a first pixel of the image sensor and wherein the second portion of the semiconductor substrate comprises a second active photosensitive area forming a second pixel of the image sensor.

13. The method of claim 11, wherein the first fill material region is formed prior to etching the second portion of the semiconductor substrate.

14. The method of claim 11, wherein the first and second portions are etched at a back side surface of the semiconductor substrate, the back side surface being the opposite of a front side surface of the semiconductor substrate at which the interconnection stack is formed.

15. The method of claim 11, wherein the second portion of the semiconductor substrate is masked while etching the first portion of the semiconductor substrate.

16. The method of claim 11, wherein the first and second portions of the semiconductor substrate have the same lateral dimensions.

17. A method of forming an image sensor, the method comprising:
forming active photosensitive areas in a thick semiconductor substrate;
forming an interconnection stack over a front side of the thick semiconductor substrate, the interconnection stack comprising a stack of insulating and metal layers;
thinning the thick semiconductor substrate to the semiconductor substrate;

etching trenches extending completely through the semiconductor substrate to separate the semiconductor substrate into a first portion, a second portion, a third portion, and a fourth portion;

filling the trenches with an insulating material;

after filling the trenches, etching the first portion to a first thickness;

forming a first fill material region over a remaining portion of the first portion of the semiconductor substrate;

after forming the first fill material region, etching the second portion to a second thickness that is different than the first thickness;

forming a second fill material region over a remaining portion of the second portion of the semiconductor substrate;

after forming the second fill material region, etching the third portion to a third thickness that is different than the first thickness and the second thickness;

forming a third fill material region over a remaining portion of the third portion of the semiconductor substrate;

after forming the third fill material region, etching the fourth portion to a fourth thickness that is different than the first thickness, the second thickness, the third thickness;

forming a fourth fill material region over a remaining portion of the fourth portion of the semiconductor substrate;

coating exposed major surfaces of the first fill material region, the second fill material region, third fill material region, the fourth fill material region, and the insulating material in the trenches with a planarization layer made of an insulating material; and forming a microlens layer over the first, second, third, and fourth portions of the semiconductor substrate.

18. The method of claim 17, wherein the first portion of the semiconductor substrate comprises a first active photosensitive area forming a first pixel of the image sensor, wherein the second portion of the semiconductor substrate comprises a second active photosensitive area forming a second pixel of the image sensor, wherein the third portion of the semiconductor substrate comprises a third active photosensitive area forming a third pixel of the image sensor, and wherein the fourth portion of the semiconductor substrate comprises a fourth active photosensitive area forming a fourth pixel of the image sensor.

19. The method of claim 17, wherein the second portion is disposed between the third portion and the first portion, wherein the third portion is disposed between the fourth portion and the second portion, the second thickness being greater than either the first thickness or the third thickness, the fourth thickness being greater than either the first thickness or the third thickness.

\* \* \* \* \*